(12) United States Patent
Lin

(10) Patent No.: US 12,055,855 B2
(45) Date of Patent: Aug. 6, 2024

(54) EXTREME ULTRAVIOLET LITHOGRAPHY METHOD USING ROBUST, HIGH TRANSMISSION PELLICLE

(71) Applicant: TAIWAN SEMICONDUCTOR MANUFACTURING CO., LTD., Hsinchu (TW)

(72) Inventor: Yun-Yue Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/301,701

(22) Filed: Apr. 17, 2023

(65) Prior Publication Data

US 2023/0251566 A1 Aug. 10, 2023

Related U.S. Application Data

(60) Continuation of application No. 17/728,945, filed on Apr. 25, 2022, now Pat. No. 11,656,544, which is a division of application No. 16/885,126, filed on May 27, 2020, now Pat. No. 11,314,169.

(60) Provisional application No. 62/928,230, filed on Oct. 30, 2019.

(51) Int. Cl.
G03F 7/20 (2006.01)
G03F 1/62 (2012.01)
G03F 1/64 (2012.01)
G03F 7/00 (2006.01)

(52) U.S. Cl.
CPC .............. *G03F 7/2004* (2013.01); *G03F 1/62* (2013.01); *G03F 1/64* (2013.01); *G03F 7/70983* (2013.01)

(58) Field of Classification Search
USPC ............................................................ 40/5
See application file for complete search history.

(56) References Cited

U.S. PATENT DOCUMENTS

| 7,935,547 | B2 | 5/2011 | Lucas et al. |
| 8,764,995 | B2 | 7/2014 | Chang et al. |
| 8,796,666 | B1 | 8/2014 | Huang et al. |
| 8,828,625 | B2 | 9/2014 | Lu et al. |
| 8,841,047 | B2 | 9/2014 | Yu et al. |
| 8,877,409 | B2 | 11/2014 | Hsu et al. |
| 9,093,530 | B2 | 7/2015 | Huang et al. |
| 9,184,054 | B1 | 11/2015 | Huang et al. |
| 9,256,123 | B2 | 2/2016 | Shih et al. |
| 9,529,268 | B2 | 12/2016 | Chang et al. |
| 9,548,303 | B2 | 1/2017 | Lee et al. |
| 10,073,337 | B2 | 9/2018 | Jung et al. |
| 10,108,084 | B2 | 10/2018 | Ono et al. |
| 10,437,143 | B2 | 10/2019 | Jeon et al. |
| 10,534,256 | B2 | 1/2020 | Chen et al. |
| 11,009,802 | B2 | 5/2021 | Schnieders |
| 2017/0038676 | A1 | 2/2017 | Jung |
| 2018/0329291 | A1 | 11/2018 | Timmermans |
| 2019/0137865 | A1 | 5/2019 | Lin |
| 2019/0204730 | A1 | 7/2019 | Lin |

FOREIGN PATENT DOCUMENTS

| CN | 106406021 A | 2/2017 |
| CN | 106462052 A | 2/2017 |
| CN | 107015431 A | 8/2017 |
| CN | 108231554 A | 8/2018 |
| CN | 108663898 A | 10/2018 |
| JP | 2018194838 A | 12/2018 |
| KR | 20170016159 A | 2/2017 |
| TW | 200737302 A | 10/2007 |
| TW | 201610562 A | 3/2016 |
| TW | 201638001 A | 11/2016 |
| TW | 201723644 A | 7/2017 |
| TW | 201932988 A | 8/2019 |

OTHER PUBLICATIONS

Ivan Pollentier et al., "EUV lithography imaging using novel pellicle membranes", Proc. SPIE 9776, Extreme Ultraviolet (EUV) Lithography VII, 977620, Mar. 18, 2016.
CN Office Action dated Jan. 5, 2024 as received in Application No. 202011057752.3.

*Primary Examiner* — Christopher G Young
(74) *Attorney, Agent, or Firm* — Maschoff Brennan

(57) ABSTRACT

A robust, high-transmission pellicle for extreme ultraviolet lithography systems is disclosed. In one example, the present disclosure provides a pellicle that includes a membrane and a frame supporting the membrane. The membrane may be formed from at least one of a transparent carbon-based film and a transparent silicon based film. The at least one of the transparent carbon-based film and the transparent silicon based film may further be coated with a protective shell. The frame may include at least one aperture to allow for a flow of air through a portion of the pellicle.

20 Claims, 6 Drawing Sheets

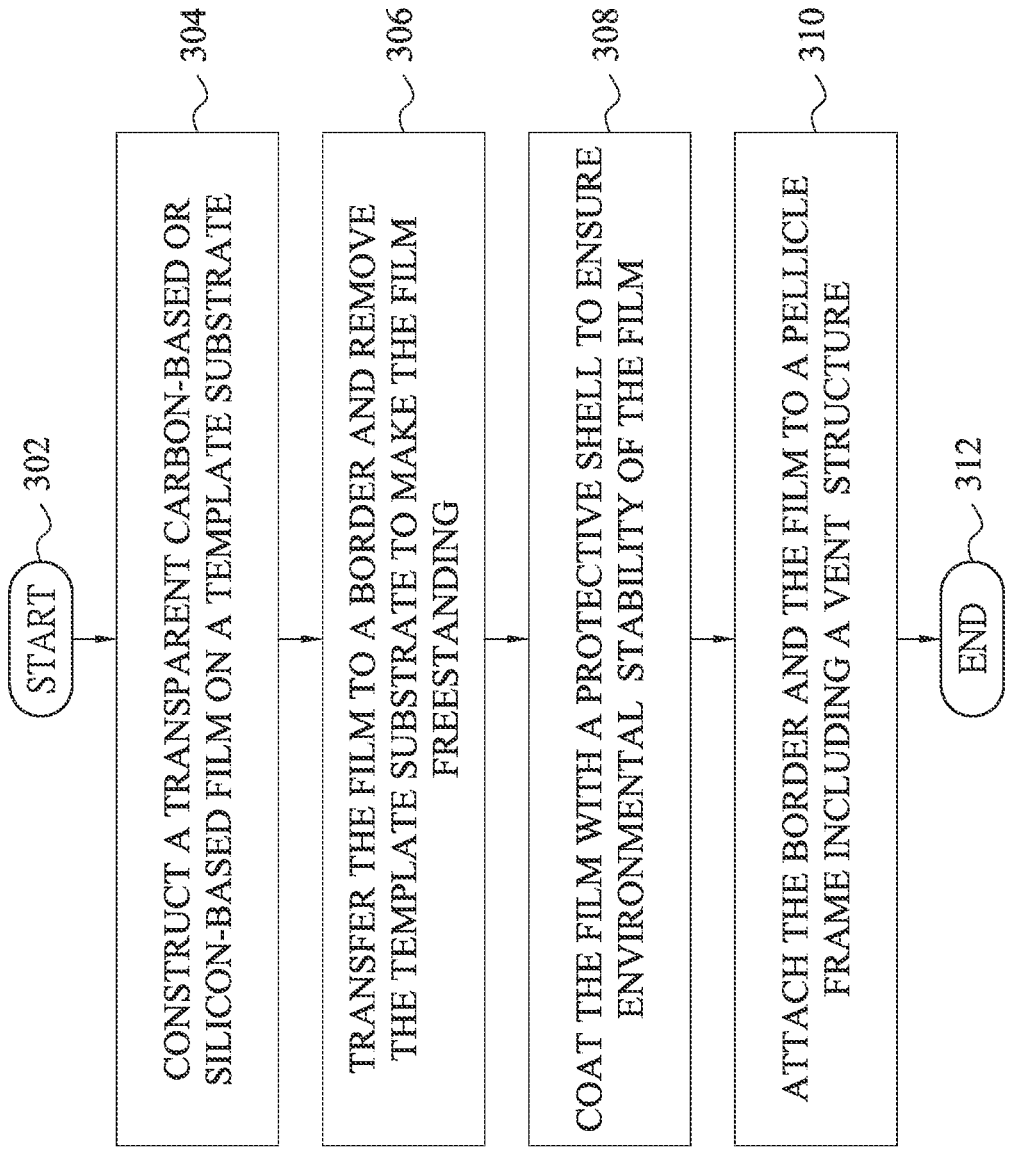

EXTREME ULTRAVIOLET LITHOGRAPHY METHOD USING ROBUST, HIGH TRANSMISSION PELLICLE

CROSS REFERENCE TO RELATED APPLICATIONS

This application is a continuation application of U.S. patent application Ser. No. 17/728,945 filed Apr. 25, 2022, which is a divisional application of U.S. patent application Ser. No. 16/885,126 filed May 27, 2020, now U.S. Pat. No. 11,314,169, issued on Apr. 26, 2022, which claims the benefit of U.S. Provisional Patent Application Ser. No. 62/928,230, filed Oct. 30, 2019, all of which are herein incorporated by reference in their entireties.

BACKGROUND

Extreme ultraviolet (EUV) lithography is an optical lithography technique in which the scanner uses light in the extreme ultraviolet region (e.g., spanning wavelengths of approximately one to one hundred nanometers). A light source is configured to emit EUV radiation. For instance, the light source may vaporize a molten metal such as tin into a highly ionized plasma that emits the EUV radiation. The EUV radiation is subsequently guided, using a series of optics (e.g., including multilayer mirrors), into the scanner. In the scanner, the EUV radiation is used to project a pattern, which is etched into a photomask, onto a silicon wafer. The EUV process can be used to fabricate a high resolution pattern of lines onto the silicon wafer, potentially at a scale of seven nanometers or beyond.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a flow diagram illustrating a method 300 for assembling a pellicle for a lithography process, according to one example of the present disclosure.

DETAILED DESCRIPTION

Figure 1:
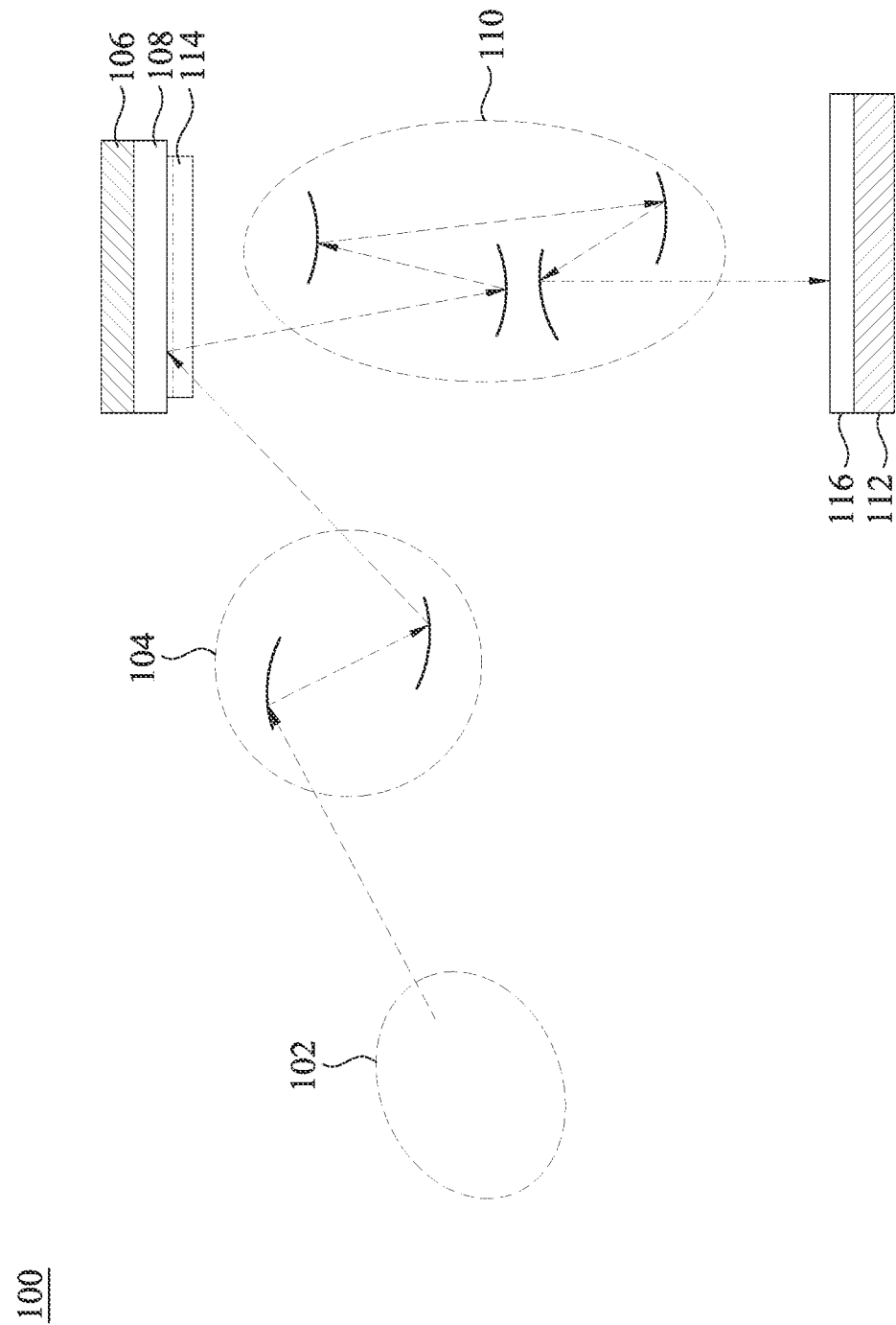
FIG. 1 is a simplified schematic diagram of an example lithography system, according to examples of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In one example, the present disclosure provides a robust, high transmission pellicle for extreme ultraviolet (EUV) lithography systems. As discussed above, an EUV lithography system may use EUV radiation to project a pattern formed in a photomask onto a silicon wafer, and the pattern may be etched into the wafer. In some examples, a pellicle (e.g., a thin, transparent film or membrane) may be used to protect the photomask from contamination. For instance, particles may fall onto the surface of the photomask. When the scanner subsequently prints the photomask pattern onto the wafer, the particles may also print onto the wafer, resulting in defects in the pattern. However, a properly positioned pellicle can prevent the particles from falling onto the photomask.

Although pellicles can reduce photomask contamination, pellicles can also reduce the amount of EUV radiation that reaches the photomask. For instance, if the membrane of the pellicle is too thick, the membrane may absorb much of the EUV radiation before the EUV radiation can reach the photomask, which may in turn reduce the throughput of the EUV lithography system. Moreover, many common membrane materials are prone to mechanical deformation under the typical processing conditions of an EUV lithography system. For example, an EUV lithography system may operate at as high as 250 Watts for high volume manufacturing; under such conditions, the temperature of the pellicle membrane may reach up to 686 degrees Celsius, which is well over the melting point of many materials. As such, conventional pellicles may need to be replaced relatively frequently.

Examples of the present disclosure provide a robust, high transmission pellicle that is resistant to temperature- and pressure-induced deformation and that transmits a high percentage (e.g., greater than eighty-two percent, and in some examples greater than ninety percent) of radiation onto the photomask. In one example, the pellicle membrane comprises a carbon-based or silicon-based material, such as a transparent carbon nanotube film or a transparent silicon nanowire film, which is coated with a shell to ensure environmental stability. Thus, the pellicle membrane is mechanically robust while allowing for improved transmission of radiation. In further examples, the pellicle frame that supports the pellicle membrane over the photomask may include a vent structure that minimizes the pressure differential between the sides of the pellicle membrane (e.g., the side facing the photomask and the side facing away from the photomask). Thus, environmental factors that may contribute to deformation of the pellicle membrane may also be minimized.

Additional features can be added to the pellicle disclosed herein. Some of the features described below can also be replaced or eliminated for different examples. Although some examples disclosed below discuss operations that are performed in a particular order, these operations may be performed in other orders as well without departing from the scope of the present disclosure.

Moreover, the pellicle and methods disclosed herein may be deployed in a plurality of applications, including the fabrication of fin-type field effect transistors (finFETs). For instance, examples of the present disclosure may be well suited for patterning the fins of a finFET to produce a relatively close spacing between features. In further examples, spacers used in forming the fins of the finFET may be processed according to examples of the present disclosure.

FIG. 1 is a simplified schematic diagram of an example lithography system 100, according to examples of the present disclosure. The lithography system 100 may also be referred to herein as a "scanner" that is operable to perform lithography exposing processes with respective radiation sources and exposure modes.

In one example, the lithography system 100 generally comprises a high-brightness light source 102, an illuminator 104, a mask stage 106, a photomask 108, a projection optics module 110, and a substrate stage 112. In some examples, the lithography system may include additional components that are not illustrated in FIG. 1. In further examples, one or more of the high-brightness light source 102, the illuminator 104, the mask stage 106, the photomask 108, the projection optics module 110, and the substrate stage 112 may be omitted from the lithography system 100 or may be integrated into combined components.

The high-brightness light source 102 may be configured to emit radiation having wavelengths in the range of approximately one nanometer to 250 nanometers. In one particular example, the high-brightness light source 102 generates EUV light with a wavelength centered at approximately 13.5 nanometers; accordingly, in some examples, the high-brightness light source 102 may also be referred to as an "EUV light source." However, it will be appreciated that the high-brightness light source 102 should not be limited to emitting EUV light. For instance, the high-brightness light source 102 may be utilized to perform any high-intensity photon emission from excited target material.

In one example, the term "approximately" is understood to mean +/− twenty percent of the stated value, and more typically +/− ten percent of the stated value, and more typically +/− five percent of the stated value, and more typically +/− three percent of the stated value, and more typically +/− two percent of the stated value, and more typically +/− one percent of the stated value, and even more typically +/− 0.5 percent of the stated value. The stated value is therefore an approximate value. In the absence of any specific description, any stated value stated herein is approximate in accordance with the above definition.

In some examples (e.g., where the lithography system 100 is a UV lithography system), the illuminator 104 comprises various refractive optical components, such as a single lens or a lens system comprising multiple lenses (zone plates). In another example (e.g., where the lithography system 100 is an EUV lithography system), the illuminator 104 comprises various reflective optical components, such as a single mirror or a mirror system comprising multiple mirrors. The illuminator 104 may direct light from the high-brightness light source 102 onto the mask stage 106, and more particularly onto the photomask 108 that is secured onto the mask stage 106. In an example where the high-brightness light source 102 generates light in the EUV wavelength range, the illuminator 104 comprises reflective optics.

The mask stage 106 may be configured to secure the photomask 108. In some examples, the mask stage 106 may include an electrostatic chuck (e-chuck) to secure the photomask 108. This is because the gas molecules absorb EUV light, and the lithography system 100 for EUV lithography patterning is maintained in a vacuum environment to minimize EUV intensity loss. Herein, the terms "photomask," "mask," and "reticle" may be used interchangeably. In one example, the photomask 108 is a reflective mask.

In some examples, a pellicle 114 may be positioned over the photomask 108, e.g., between the photomask 108 and the substrate stage 112. The pellicle 114 may protect the photomask 108 from particles and may keep the particles out of focus, so that the particles do not produce an image (which may cause defects on a wafer during the lithography process).

The projection optics module 110 may be configured for imaging the pattern of the photomask 108 onto a semiconductor wafer 116 secured on the substrate stage 112. In one example, the projection optics module 110 comprises refractive optics (such as for a UV lithography system). In another example, the projection optics module 110 comprises reflective optics (such as for an EUV lithography system). The light directed from the photomask 108, carrying the image of the pattern defined on the photomask 108, may be collected by the projection optics module 110. The illuminator 104 and the projection optics module 110 may be collectively referred to as an "optical module" of the lithography system 100.

In some examples, the semiconductor wafer 116 may be a bulk semiconductor wafer. For instance, the semiconductor wafer 116 may comprise a silicon wafer. The semiconductor wafer 116 may include silicon or another elementary semiconductor material, such as germanium. In some examples, the semiconductor wafer 116 may include a compound semiconductor. The compound semiconductor may include gallium arsenide, silicon carbide, indium arsenide, indium phosphide, another suitable material, or a combination thereof.

In some examples, the semiconductor wafer 116 includes a silicon-on-insulator (SOI) substrate. The SOI substrate may be fabricated using a separation by implantation of oxygen (SIMOX) process, a wafer bonding process, another applicable process, or a combination thereof.

In some examples, the semiconductor wafer 116 comprises an undoped substrate. However, in other examples, the semiconductor substrate 116 comprises a doped substrate, such as a p-type substrate or an n-type substrate.

In some examples, the semiconductor wafer 116 includes various doped regions (not shown) depending on the design requirements of the semiconductor device structure. The doped regions may include, for example, p-type wells and/or n-type wells. In some examples, the doped regions are doped with p-type dopants. For example, the doped regions may be doped with boron or boron fluoride. In other examples, the doped regions are doped with n-type dopants. For example, the doped regions may be doped with phosphor or arsenic.

In some examples, some of the doped regions are p-doped and other doped regions are n-doped.

In some examples, an interconnection structure may be formed over the semiconductor wafer 116. The interconnection structure may include multiple interlayer dielectric layers, including dielectric layers. The interconnection structure may also include multiple conductive features formed in the interlayer dielectric layers. The conductive features may include conductive lines, conductive vias, and/or conductive contacts.

In some examples, various device elements are formed in the semiconductor wafer 116. Examples of the various device elements may include transistors (e.g., metal oxide semiconductor field effect transistors (MOSFETs), complementary metal oxide semiconductor (CMOS) transistors, bipolar junction transistors (BJTs), high-voltage transistors, high-frequency transistors, p-channel and/or n-channel field effect transistors (PFETs and/or NFETs), diodes, or other suitable elements. Various processes may be used to form the various device elements, including deposition, etching, implantation, photolithography, annealing, and/or other applicable processes.

The device elements may be interconnected through the interconnection structure over the semiconductor wafer 116 to form integrated circuit devices. The integrated circuit devices may include logic devices, memory devices (e.g., static random access memory (SRAM) devices), radio frequency (RF) devices, input/output (I/O) devices, system-on-chip (SoC) devices, image sensor devices, other applicable devices, or a combination thereof.

In some examples, the semiconductor wafer 116 may be coated with a resist layer that is sensitive to EUV light. Various components including those described above may be integrated together and may be operable to perform lithography exposing processes.

Figure 2A:
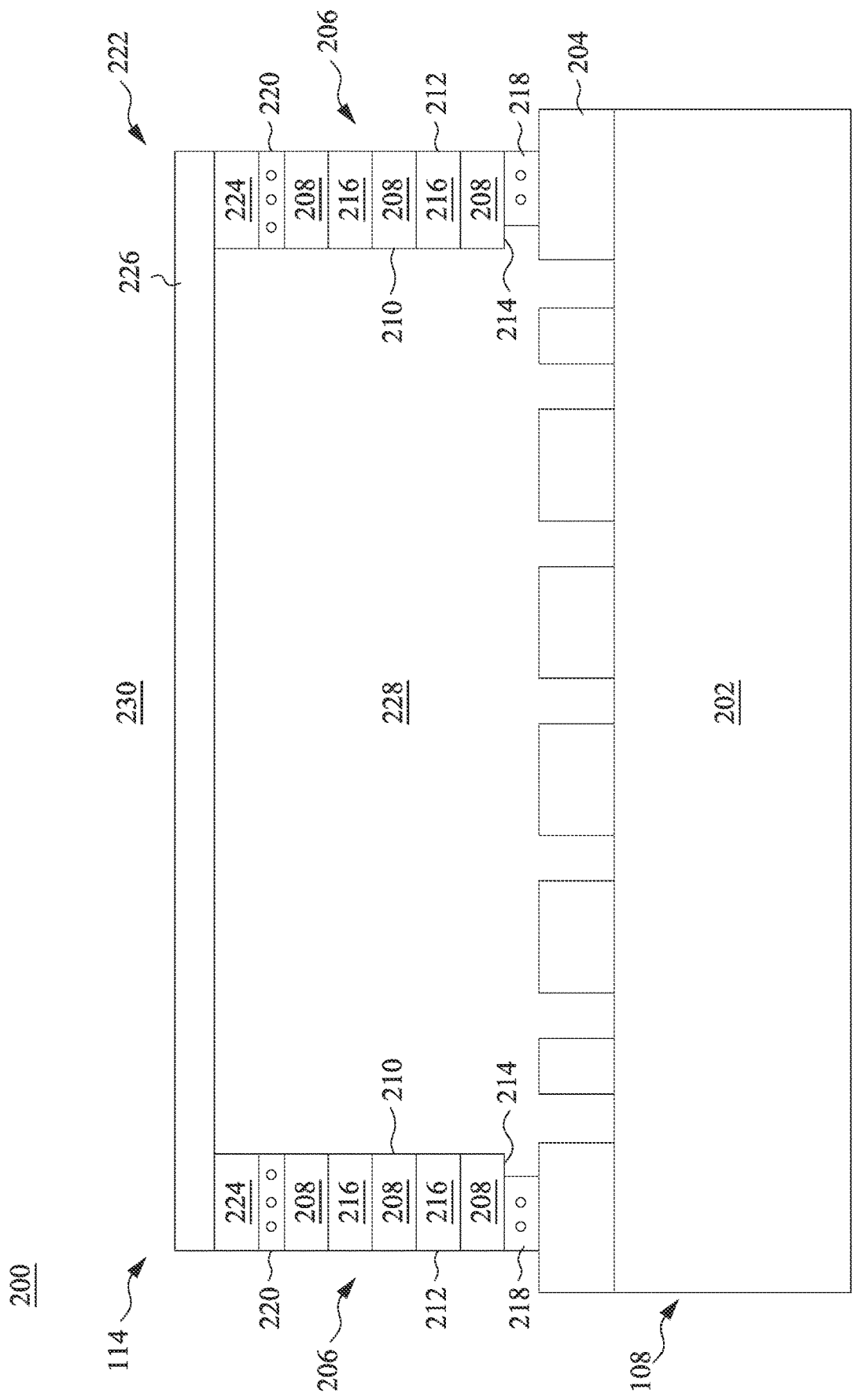
FIG. 2A is a cross sectional view of an example pellicle-photomask structure, according to examples of the present disclosure.
Figure 2B:
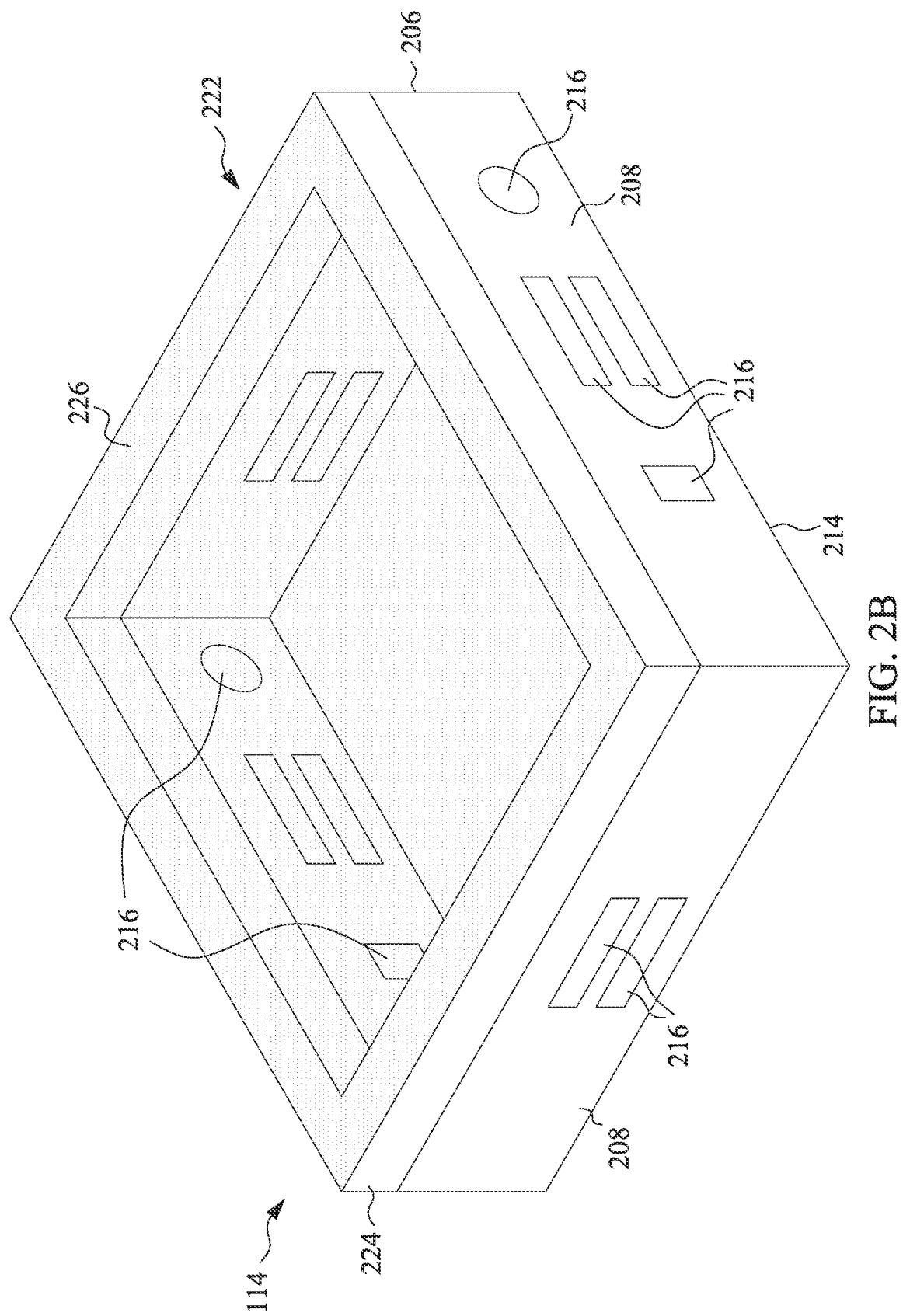
FIG. 2B is an isometric view of the example pellicle-photomask structure of FIG. 2A.

FIG. 2A is a cross sectional view of an example pellicle-photomask structure 200, according to examples of the present disclosure. FIG. 2B is an isometric view of the example pellicle-photomask structure 200 of FIG. 2A. As illustrated in FIGS. 2A and 2B, the photomask 108 may include a mask substrate 202 and a mask pattern 204 positioned over the mask substrate 202.

In some examples, the mask substrate 202 comprises a transparent substrate, such as fused silica that is relatively free of defects, borosilicate glass, soda-lime glass, calcium fluoride, low thermal expansion material, ultra-low thermal expansion material, or other applicable materials. The mask pattern 204 may be positioned over the mask substrate 202 as discussed above and may be designed according to the integrated circuit features to be formed over a semiconductor substrate (e.g., wafer 116 of FIG. 1) during a lithography process. The mask pattern 204 may be formed by depositing a material layer and patterning the material layer to have one or more openings where beams of radiation may travel through without being absorbed, and one or more absorption areas which may completely or partially block the beams of radiation.

The mask pattern 204 may include metal, metal alloy, metal silicide, metal nitride, metal oxide, metal oxynitride, or other applicable materials. Examples of materials that may be used to form the mask pattern 204 may include, but are not limited to, Cr, $Mo_xSi_y$, $Ta_xSi_y$, Mo, $Nb_xO_y$, Ti, Ta, $Cr_xN_y$, $Mo_xO_y$, $Mo_xN_y$, $Cr_xO_y$, $Ti_xN_y$, $Zr_xN_y$, $Ti_xO_y$, $Ta_xN_y$, $Ta_xO_y$, $Si_xO_y$, $Nb_xN_y$, $Zr_xN_y$, $Al_xO_yN_z$, $Ta_xB_yO_z$, $Ta_xB_yN_z$, $Ag_xO_y$, $Ag_xN_y$, Ni, $Ni_xO_y$, $Ni_xO_yN_z$, and/or the like. The compound x/y/z ratio is not limited.

In some examples, the photomask 108 is an EUV mask. However, in other examples, the photomask 108 may be an optical mask.

As illustrated in FIGS. 2A and 2B, the pellicle 114 may be positioned over the photomask 108. In one example, the pellicle 114 includes a pellicle frame 206 that may be positioned over at least one of the mask substrate 202 and the mask pattern 204. In one example, the pellicle frame 206 may be formed from Si, SiC, SiN, glass, a low coefficient of thermal expansion material (such as an Al alloy, a Ti alloy, Invar, Kovar, or the like), another suitable material, or a combination thereof. In some examples, suitable processes for forming the pellicle frame 206 may include machining processes, sintering processes, photochemical etching processes, other applicable processes, or a combination thereof.

In one example, the pellicle frame 206 may include a side portion 208 having an inside surface 210 and an outside surface 212, where the inside surface 210 and the outside surface 212 are oriented on opposite sides of the side portion 208. The pellicle frame 206 may further include a bottom surface 214 or base that connects the inside surface 210 and the outside surface 212.

As illustrated in FIGS. 2A and 2B, the pellicle-mask structure 200 may further include a vent structure 216 formed in the side portion 208 and extending from the inside surface 210 through to the outside surface 212. In some examples, the vent structure 216 may comprise one or more apertures formed in the side portion 208 of the pellicle frame 206. The apertures may take any shape, including circular apertures, rectangular apertures, slit-shaped apertures, other shapes, or any combination thereof. The apertures may allow for a flow of air through a portion of the pellicle-mask structure 200, as discussed in further detail below. In some examples, the apertures may include filters to minimize passage of outside particles through the vent structure 216.

In some examples, where the vent structure includes filters, the vent structure 216 may be formed together with the pellicle frame 206. In some examples, the vent structure 216 may be formed using a photochemical etching process, another applicable process, or a combination thereof.

In other examples, again where the vent structure includes filters, the vent structure 216 and the pellicle frame 206 may be formed separately, and an opening (not shown) may be formed in the side portion 208 of the pellicle frame 206. Afterwards, in some examples, the vent structure 216 may be placed into the opening in the side portion 208 of the pellicle frame 206. The vent structure 216 may then be bonded to the pellicle frame 206, e.g., by a brazing process, a direct diffusion bond process, a eutectic bonding process, another applicable process, or a combination thereof.

In some examples, the vent structure 216 may prevent the pellicle membrane from rupturing during the EUV lithography process, as discussed in further detail below.

As further illustrated in FIGS. 2A and 2B, the pellicle-mask structure 200 may further include a pellicle frame adhesive 218 positioned between the pellicle frame 206 and the mask substrate 202.

In some examples, the pellicle frame adhesive 218 may be formed from a crosslink type adhesive, a thermoplastic elastomer type adhesive, a polystyrene type adhesive, an acrylic type adhesive, a silicon-based adhesive, an epoxy type adhesive, or a combination thereof.

In some examples, a surface treatment may be performed on the pellicle frame 206 to enhance the adhesion of the pellicle frame 206 to the pellicle frame adhesive 218. In some examples, the surface treatment may include an oxygen plasma treatment, another applicable treatment, or a combination thereof. However, in other examples, no surface treatment may be performed on the pellicle frame 206.

The pellicle-mask structure 200 may further include a pellicle membrane adhesive 220 positioned over the pellicle frame 206. In some examples, the pellicle membrane adhesive 220 may be formed from a thermoplastic elastomer type adhesive, a polystyrene type adhesive, an acrylic type adhesive, a silicon-based adhesive, an epoxy type adhesive, another suitable adhesive, or a combination thereof. In some examples, the pellicle membrane adhesive 220 may be formed from a material that is different from the material making up the pellicle frame adhesive 218.

As further illustrated in FIGS. 2A and 2B, the pellicle-mask structure 200 may further include a pellicle membrane 222 positioned over the pellicle frame 206 and the pellicle membrane adhesive 220. As illustrated, the pellicle membrane adhesive 220 may be positioned between the pellicle membrane 222 and the pellicle frame 206.

In some examples, the pellicle membrane 222 may include a border 224 positioned over the pellicle membrane adhesive 220 and a top membrane portion 226 positioned over the border 224. In some examples, the border 224 may be formed from Si. In further examples, the border 224 may be formed from boron carbide, C, graphene, carbon nanotube, SiC, SiN, $SiO_2$, SiON, Zr, Nb, Mo, Cd, Ru, Ti, Al, Mg, V, Hf, Ge, Mn, Cr, W, Ta, Ir, Zn, Cu, F, Co, Au, Pt, Sn, Ni, Te, Ag, another suitable material, an allotrope of any of these materials, or a combination thereof. The border 224 may mechanically support the top membrane portion 226 around the periphery of the top membrane portion 226. The border 224 may, in turn, be mechanically supported by the pellicle frame 206 when the pellicle-mask structure 200 is fully assembled. That is, the pellicle frame 206 may mechanically support the border 224 and the top membrane portion 226 of the pellicle membrane 222 on the photomask 108.

In one example, the vent structure 216 of the pellicle frame 206 may be formed so that at least one side portion 208 of the pellicle frame 206 includes one aperture formed in both the top of the side portion 208 (e.g., near the border 224) and another aperture formed in the bottom of the side portion 208 (e.g., near the mask pattern 204).

In some examples, the top membrane portion 226 may be formed from a transparent carbon-based film or a transparent silicon-based film, such as a carbon nanotube film or a silicon nanowire film.

Figure 2D:
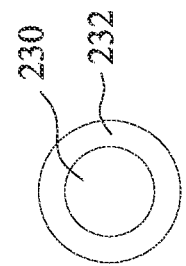
FIG. 2D, for instance, illustrates a cross sectional view of an example carbon nanotube of the network of carbon nanotubes illustrated in FIG. 2C.
Figure 2C:
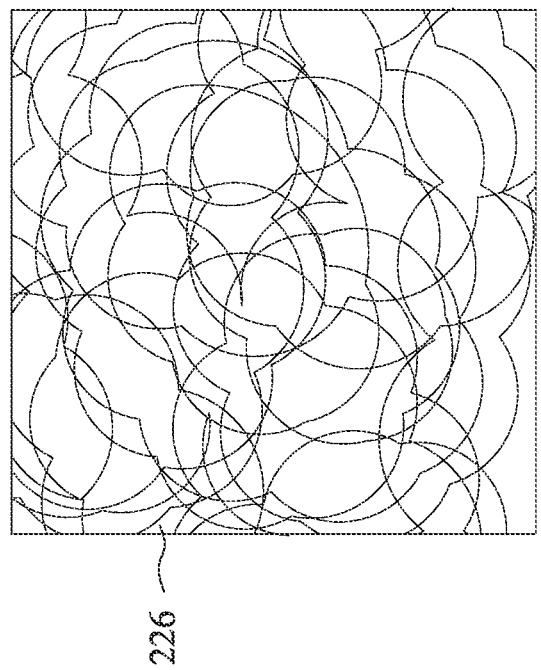
FIG. 2C illustrates an example top membrane portion of the pellicle membrane of FIGS. 2A and 2B.

FIG. 2C, for instance, illustrates an example top membrane portion 226 of the pellicle membrane 222 of FIGS. 2A and 2B. In the example illustrated in FIG. 2C, the top membrane portion 226 comprises a carbon nanotube film. In this example, the network of carbon nanotubes making up the carbon nanotube film may have a structure density of between 0.2 and one, depending on the desired percentage of radiation to be transmitted by the pellicle 114. For instance, carbon nanotube films have been shown to achieve up to approximately ninety percent visible light transmittance. In general, a one nanometer tube thickness for the carbon nanotubes should translate into approximately 0.5 to one percent absorption for radiation in the extreme ultraviolet wavelengths. The precise structure density may be chosen to maximize EUV radiation transmission while minimizing passage of particles through the top membrane portion 226. For instance, although a looser structure density may allow for greater EUV radiation transmission, the looser structure density may also allow particles to fall through to the photomask 108. The carbon nanotube film may be formed by a roll-to-roll process, another suitable process, or any combination thereof.

In some examples, the carbon-based film or the silicon-based film may further be coated with a protective shell. FIG. 2D, for instance, illustrates a cross sectional view of an example carbon nanotube 230 of the network of carbon nanotubes illustrated in FIG. 2C. As illustrated, the carbon nanotube 230 is coated with a protective shell 232. The protective shell 232 may comprise, for instance, Ru, Mo, Zr, B, Nb, MoSi, SiN, SiO, another suitable material, or a combination thereof. The protective shell 232 may have a thickness that is between 0.1 and ten nanometers. The material and the thickness of the protective shell 232 may be selected to provide high transmission of EUV radiation, to dissipate heat from the top membrane portion 226, and to minimize dissipation with the film material (e.g., carbon or silicon). In one example, the protective shell 232 may be deposited onto the network of carbon nanotubes using atomic layer deposition, physical vapor deposition, chemical vapor deposition, wet chemical plating, another suitable process, or any combination thereof.

In some examples, the border 224 and/or the top membrane portion 226 may include multiple layers. In some examples, the pellicle membrane 222 may be formed using a substrate backside photo/etching process, another applicable process, or a combination thereof.

In some examples, the material of the border 224 is the same as the material of the top membrane portion 226. In other examples, however, material of the border 224 is different from the material of the top membrane portion 226. For instance, the border 224 may be formed from silicon, while the top membrane portion 226 comprises a carbon nanotube film. In some examples, the thickness of the top membrane portion 226 is between ten nanometers and one hundred nanometers. In more particular examples, the thickness of the top membrane portion 226 is between twenty and fifty nanometers. These ranges have been found to provide sufficient robustness to the top membrane portion 226, while also providing high EUV transmission. In general, the thicker the top membrane portion 226, the more robust the top membrane portion 226 will be; however, if the top membrane portion 226 is too thick, the percentage of EUV transmission may decrease. Thus, the disclosed ranges strike a balance between these two aims.

In some examples, either or both of the pellicle frame adhesive 218 and the pellicle membrane adhesive 220 may include heat-dissipating fillers. The heat-dissipating fillers may include, for example, aluminum nitride, boron nitride, aluminum oxide, magnesium oxide, silicon oxide, graphite, metal powder, ceramic powder, another suitable material, or a combination thereof. In some cases, the EUV lithography process may involve a high-energy light beam that penetrates the pellicle membrane 222, causing the temperature of the pellicle membrane 222 to increase. The heat-dissipating fillers may help to dissipate the heat of the pellicle membrane 222 through the pellicle membrane adhesive 220, to the pellicle frame 206, to the pellicle frame adhesive 218, to the mask 108 and the EUV lithography apparatus. Thus, the temperature of the pellicle membrane 222 may be decreased during EUV lithography processing, thereby reducing the likelihood of the pellicle membrane 222 rupturing.

As illustrated in FIG. 2A, the pellicle 114 and the mask 108 may form an enclosed inner volume 228 that is enclosed by the pellicle 114 and the mask 108. The pellicle 114 and the mask 108 may separate the inner volume 228 from an outer environment 230. The vent structure 216 may extend from the inner volume 228 through to the outer environment 230.

In some examples, the EUV lithography process may be performed under extremely high vacuum conditions. In such conditions, a pellicle-mask structure lacking sufficient ventilation might rupture due to the pressure differential between the inner volume 228 (e.g., the side of the pellicle 114 facing the mask 108) and the outer environment 230 (e.g., the side of the pellicle 114 facing away from the mask 108). However, the pellicle-mask structure 200 of FIGS. 2A and 2B is less prone to rupture, since the vent structure 216 allows the pressure in the inner volume 228 to be balanced with the pressure in the outer environment 230 during an EUV lithography process.

In some examples, the pellicle frame 206 includes the side portions 208, and the pellicle-mask structure 200 includes at least one vent structure 216 positioned in the side portion 208. In some examples, as shown in FIG. 2B, the pellicle frame 206 may include four side portions 208; accordingly, the pellicle-mask structure 200 may include at least four corresponding vent structures 216. In some examples, the four vent structures 216 may be positioned in the four side portions 208, respectively. However, many variations and/or modifications can be made to the example shown in FIG. 2B. For instance, in some examples, the pellicle-mask structure 200 may include additional vent structures 216. In some examples, two or more vent structures 216 may be formed in a single side portion 208. In other examples, some of the side portions 208 may include no vent structure 216. In further examples, a vent structure 216 may consume the entire area of a side portion 208.

It will be appreciated that FIG. 1 represents a simplified form of a lithography system 100. In some examples, the lithography system 100 may include additional components that are not illustrated, such as additional optics, a plasma source, and other components.

FIG. 3 is a flow diagram illustrating a method 300 for assembling a pellicle for a lithography process, according to one example of the present disclosure. For instance, the method 300 may be performed to assemble the pellicle 114 illustrated in FIGS. 1 and 2A-2B. The method 300 may be performed using one or more different machines, under the control of controller or processor.

The method 300 begins in step 302. In step 304, a transparent carbon-based or silicon-based film may be constructed on a template substrate. The template substrate may comprise, for instance, polyvinyl alcohol (PVA), polystyrene (PS), polyethylene terephthalate (PET), polyvinylidene fluoride (PVDF), or a chemical vapor deposited poly(p-xylylene) polymer (e.g., parylene C). In one example, where the film is a carbon-based film, the carbon-based film is a carbon nanotube film. In a further example, the carbon nanotube film has a nanotube network structure density of between 0.2 and one. In another example, where the film is a silicon-based film, the silicon-base film is a silicon nanowire film. In one example, the carbon-based or silicon-based film may be constructed using a roll-to-roll process in a plasma environment, such as a plasma reacting chamber (in which the reacting gas may comprise, for instance, $C_xH_y$, $H_2$, Ar, $O_2$, another suitable gas, or any combination thereof).

In step 306, the transparent carbon-based or silicon-based film may be transferred to a border, and the template substrate may be removed to make the carbon-based or silicon-based film freestanding. In one example, a dry transfer technique is used to transfer the carbon-based or silicon-based film from the template substrate to the border. In one example, the border is formed of silicon. The border may have a rectangular shape, as shown in FIG. 2B.

In step 308, the transparent carbon-based or silicon-based film may be coated with a protective shell to ensure the environmental stability of the carbon-based or silicon-based film. In one example, the protective shell may comprise Ru, Mo, Zr, B, Nb, MoSi, SiN, SiO, another suitable material, or a combination thereof. The shell may have a thickness that is between 0.1 and ten nanometers.

In step 310, the border and carbon-based or silicon-based film may be attached to a pellicle frame including a vent structure. The pellicle frame may have the same shape as the border (e.g., rectangular), as shown in FIGS. 2A and 2B. In one example, the pellicle frame may be formed from Si, SiC, SiN, glass, a low coefficient of thermal expansion material (e.g., an Al alloy, a Ti alloy, Invar, Kovar, or the like), another suitable material, or any combination thereof. In a further example, the pellicle frame may include a vent structure, for instance as illustrated in FIGS. 2A and 2B. That is, the vent structure may include apertures shaped like circles, rectangles, slits, other suitable shapes, or any combination thereof.

The method may end in step 312.

Figure 4:
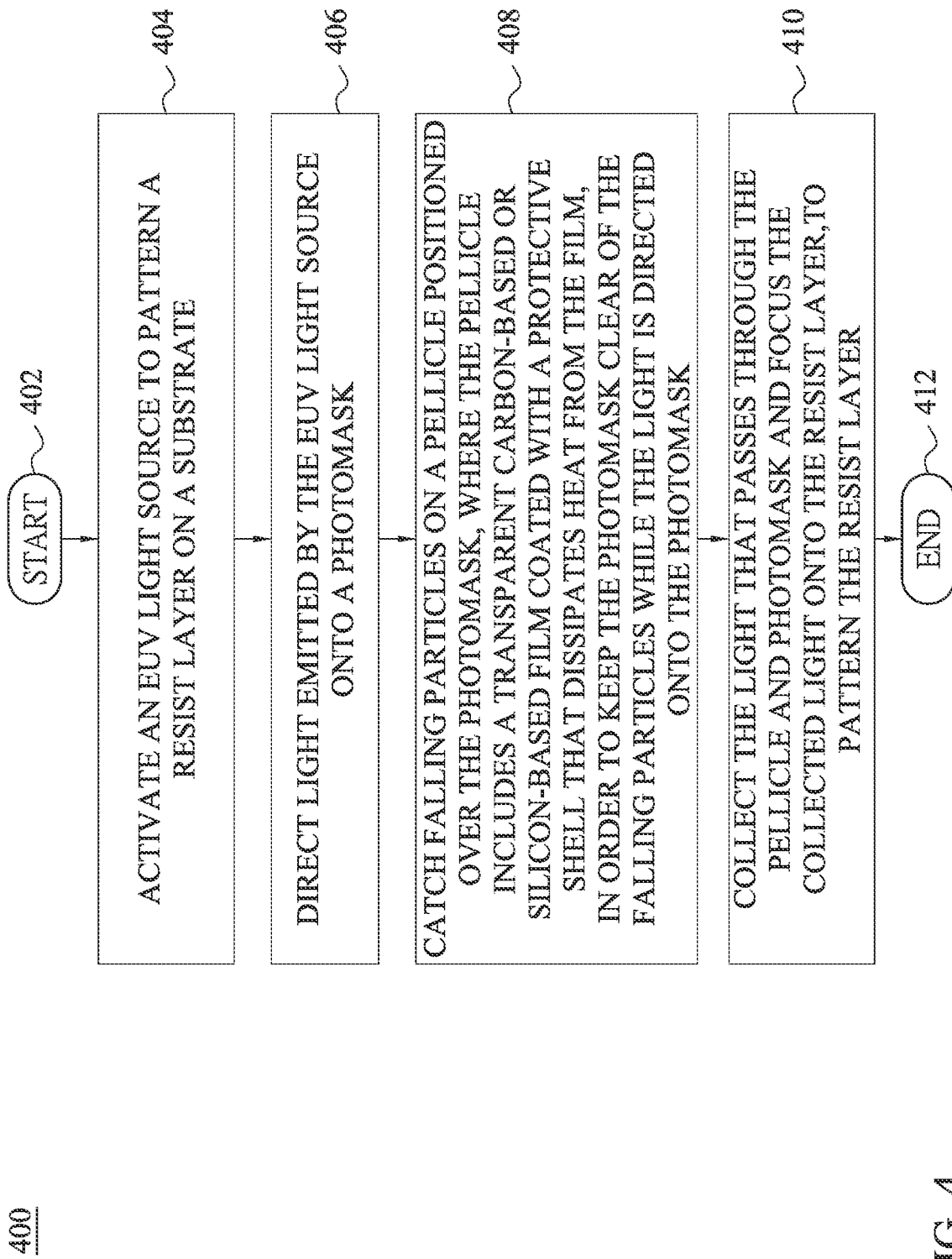
FIG. 4 illustrates a flowchart of a method of fabricating a semiconductor device according to at least one embodiment of the present disclosure.

FIG. 4 illustrates a flowchart of a method 400 of fabricating a semiconductor device according to at least one embodiment of the present disclosure. At least some steps of the method 400 may be performed via a controller of an EUV lithography system, such as the lithography system illustrated in FIG. 1.

While the method 400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

The method 400 begins in step 402. In step 404, an EUV light source may be activated to pattern a resist layer on a substrate (where the substrate may be a semiconductor wafer). For example, the EUV light source may be part of a lithography system such as the system illustrated in FIG. 1 and discussed above. Thus, the EUV light source may generate light in extreme ultraviolet wavelengths (potentially by vaporizing droplets of metal into a highly ionized plasma).

In step 406, light emitted by the EUV light source may be directed onto a photomask. The photomask may have a pattern etched into its surface, where the pattern is to be printed onto the resist layer on the substrate.

In step 408, falling particles may be caught on a pellicle that is positioned over the photomask, in order to keep the photomask clear of the falling particles while the light is being directed onto the photomask. In one example, the pellicle includes a transparent carbon-based or silicon-based film coated with a protective shell that dissipates heat from the film. The pellicle may further include a frame supporting the film, where the frame includes at least one aperture to allow for a flow of air through a portion of the pellicle. For instance, the pellicle may be arranged as shown in FIGS. 2A-2D. The pellicle may be positioned to prevent particles from falling onto and contaminating the photomask.

In step 410, the light that passes through the pellicle and photomask may be collected by a projection optics module and focused onto the resist layer, to pattern the resist layer.

For instance, exposure of the resist layer to the light may cause features having a target pitch to be printed in the resist.

In one embodiment, the blocks 404-410 may be continuously repeated during operation of the EUV light source (e.g., for multiple layers of the substrate). At block 412, the method 400 may end.

It should be noted that the methods 300 and 400 may be expanded to include additional steps or may be modified to include additional operations with respect to the steps outlined above. Furthermore, steps, blocks, functions or operations of the above described method 300 or the method 400 can be combined, separated, and/or performed in a different order from that described above, without departing from the examples of the present disclosure.

Thus, examples of the present disclosure provide a robust, high transmission pellicle that is resistant to temperature- and pressure-induced deformation and that transmits a high percentage (e.g., greater than eighty-two percent, and in some examples greater than ninety percent) of radiation onto the photomask. The pellicle of the present disclosure may be especially suitable for use in ultraviolet lithography systems, and more particularly in extreme ultraviolet lithography systems.

In one example, the present disclosure provides a pellicle that includes a membrane and a frame supporting the membrane. The membrane may be formed from at least one of a transparent carbon-based film and a transparent silicon based film. The at least one of the transparent carbon-based film and the transparent silicon based film may further be coated with a protective shell. The frame may include at least one aperture to allow for a flow of air through a portion of the pellicle.

In another example, an apparatus includes an extreme ultraviolet illumination source, an illuminator, a photomask, and a pellicle. The extreme ultraviolet illumination source is arranged to generate a beam of extreme ultraviolet illumination to pattern a resist layer on a substrate. The illuminator is arranged to direct the beam of extreme ultraviolet radiation onto a photomask. The photomask includes a pattern with which to pattern the resist layer. The pellicle includes a membrane and a frame supporting the membrane. The membrane may be formed from at least one of a transparent carbon-based film and a transparent silicon based film. The at least one of the transparent carbon-based film and the transparent silicon based film may further be coated with a protective shell. The frame may include at least one aperture to allow for a flow of air through a portion of the pellicle.

In another example, a method includes activating an extreme ultraviolet light source to pattern a resist layer on a substrate. The light emitted by the extreme ultraviolet light source is directed onto a photomask that includes a pellicle. The pellicle includes a membrane and a frame supporting the membrane. The membrane may be formed from at least one of a transparent carbon-based film and a transparent silicon based film. The at least one of the transparent carbon-based film and the transparent silicon based film may further be coated with a protective shell. The frame may include at least one aperture to allow for a flow of air through a portion of the pellicle. The light that passes through the pellicle and the photomask is collected and directed onto the resist layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   transferring a wafer coated with a photoresist layer onto a wafer stage; and
   performing a lithographic exposure process to the photoresist layer by using an extreme ultraviolet (EUV) tool, the EUV tool comprising:
   an EUV illumination source;
   a pellicle and a photomask on a downstream optical path of the EUV illumination source, wherein the pellicle covers a mask pattern of the photomask, the pellicle comprises a carbon-based film and a protective shell coated on the carbon-based film, and wherein the carbon-based film and the protective shell permits transmission of EUV radiation; and
   a plurality of optics on a reflective path from the photomask.

2. The method of claim 1, wherein the carbon-based film comprises a plurality of carbon nanotubes.

3. The method of claim 2, wherein the plurality of carbon nanotubes has a structure density of between 0.2 and 1.

4. The method of claim 1, wherein the pellicle further comprises a frame supporting the carbon-based film.

5. The method of claim 4, wherein the frame has one or more apertures allowing for a flow of gas through a portion of the pellicle.

6. The method of claim 5, wherein the one or more apertures comprise a first aperture and a second aperture more curved than the first aperture.

7. The method of claim 6, wherein the first aperture has a rectangular profile, and the second aperture has circular profile.

8. The method of claim 7, wherein the one or more apertures further comprise a third aperture with a square profile.

9. The method of claim 4, wherein the pellicle further comprises a border between the carbon-based film and the frame.

10. The method of claim 9, wherein the border is adhered to the carbon-based film by an adhesive, wherein the adhesive comprises at least one of: a thermoplastic elastomer type adhesive, a polystyrene type adhesive, an acrylic type adhesive, a silicon-based adhesive, and an epoxy type adhesive.

11. A method, comprising:
    loading a wafer to a wafer stage, the wafer being coated with a photoresist layer; and
    performing a lithographic exposure process to the photoresist layer by using an extreme ultraviolet (EUV) radiation reflected from a photomask, the photomask being covered with a pellicle, the pellicle comprising:
    an EUV-transmissive film comprising a network of nanotubes; and
    an EUV-transmissive protective shell over the network of nanotubes of the EUV-transmissive film.

12. The method of claim 11, wherein the network of nanotubes is a network of carbon nanotubes.

13. The method of claim 11, wherein the network of nanotubes has a structure density of between 0.2 and one.

14. The method of claim 11, wherein the pellicle further comprises a frame supporting the EUV-transmissive film, wherein the frame comprises a plurality of apertures on four sidewalls of the frame.

15. A method, comprising:
    placing a wafer on a wafer stage, the wafer being coated with a photoresist layer; and
    performing a lithographic exposure process to the photoresist layer by using an extreme ultraviolet (EUV) radiation reflected from a photomask, the photomask being covered with a pellicle, the pellicle comprising:
    an EUV-transmissive membrane; and
    a frame supporting the EUV-transmissive membrane, the frame comprising a vent structure that allows for a flow of air through a space between the EUV-transmissive membrane and the photomask.

16. The method of claim 15, wherein the EUV-transmissive membrane comprises at least one selected from the group of a carbon-based film and a silicon-based film.

17. The method of claim 16, wherein the at least one selected from the group of a carbon-based film and a silicon-based film is coated with a protective shell.

18. The method of claim 17, wherein the protective shell comprises Ru, Mo, Zr, B, Nb, MoSi, SiN, or SiO.

19. The method of claim 16, wherein the carbon-based film comprises a network of carbon nanotubes.

20. The method of claim 16, wherein the silicon-based film comprises a network of silicon nanowires.

\* \* \* \* \*